United States Patent
Itoh et al.

(10) Patent No.: US 8,466,048 B2
(45) Date of Patent: Jun. 18, 2013

(54) SELECTIVE RECRYSTALLIZATION OF SEMICONDUCTOR

(75) Inventors: Yoshiyuki Itoh, Osaka (JP); Masashi Maekawa, Osaka (JP); Norihisa Asano, Osaka (JP); Hiroki Taniyama, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 51 days.

(21) Appl. No.: 13/256,050

(22) PCT Filed: Mar. 9, 2010

(86) PCT No.: PCT/JP2010/001650
§ 371 (c)(1),
(2), (4) Date: Sep. 12, 2011

(87) PCT Pub. No.: WO2010/103802
PCT Pub. Date: Sep. 16, 2010

(65) Prior Publication Data
US 2011/0315995 A1 Dec. 29, 2011

(30) Foreign Application Priority Data
Mar. 13, 2009 (JP) .................................. 2009-061081

(51) Int. Cl.
*H01L 21/20* (2006.01)
(52) U.S. Cl.
USPC ........................................ 438/487; 438/155
(58) Field of Classification Search
USPC .................. 257/51, 59, 66, 67, 70, 71, 72, 75, 257/435, E29.003, E21.09; 438/155, 487; 349/44
See application file for complete search history.

(56) References Cited

U.S. PATENT DOCUMENTS

| 2004/0253819 A1* | 12/2004 | You ................................. 438/689 |
| 2005/0009249 A1* | 1/2005 | Oh et al. ........................ 438/149 |
| 2005/0045881 A1* | 3/2005 | Nakamura et al. .............. 257/59 |

FOREIGN PATENT DOCUMENTS

| JP | 1988-27066 U | 2/1988 |
| JP | H6-275808 A | 9/1994 |
| JP | 2003-249639 A | 9/2003 |
| JP | 2006-3857 A | 1/2006 |
| JP | 2009-10125 A | 1/2009 |

OTHER PUBLICATIONS

International Search Report (ISR) issued in PCT/JP2010/001650 (International application) mailed in Apr. 2010 for Examiner consideration.

* cited by examiner

*Primary Examiner* — Tucker Wright
(74) *Attorney, Agent, or Firm* — Chen Yoshimura LLP

(57) ABSTRACT

Disclosed is a semiconductor device which includes a substrate 11, a thin film transistor 20 having a first semiconductor layer 16A that is supported by the substrate 11, a thin film diode 30 having a second semiconductor layer 16B that is supported by the substrate 11, and a metal layer 12 that is formed between the substrate 11 and the second semiconductor layer 16B. The first semiconductor layer 16A is a laterally grown crystalline semiconductor film, and the second semiconductor layer 16B is a crystalline semiconductor film that contains fine crystal grains. The average surface roughness of the second semiconductor layer 16B is higher than the average surface roughness of the first semiconductor layer 16A. Consequently, the optical sensitivity of the TFD is improved and the reliability of the TFT is improved, as compared with those in the conventional semiconductor devices.

2 Claims, 5 Drawing Sheets (a)

(b)

(c)

(d)

(a)

(b)

SELECTIVE RECRYSTALLIZATION OF SEMICONDUCTOR

TECHNICAL FIELD

The present invention relates to a semiconductor device that is provided with a thin film transistor (TFT) and a thin film diode (TFD), and to a method for manufacturing the same.

BACKGROUND ART

In recent years, there have been advances in the development of semiconductor devices provided with thin film transistors (TFTs) and thin film diodes (TFDs) that are formed on the same substrate, and development of electronic equipment having such semiconductor devices.

For example, Patent Document 1 discloses an image sensor provided with an optical sensor portion that uses TFDs and driving circuits that use TFTs, provided on the same substrate. In the method for manufacturing in Patent Document 1, TFTs and TFDs are manufactured using a crystalline semiconductor film that is obtained through performing a heat treatment after adding a catalyst element to an amorphous semiconductor film that is formed on a glass substrate.

However, in the method set forth in Patent Document 1, it has been difficult to optimize the crystalline states for the individual semiconductor layers for the TFTs and the TFDs.

Given this, Patent Document 2 discloses a method for optimizing by controlling separately the crystalline states of the semiconductor layers of the TFTs and the TFDs that are formed by crystallizing the same amorphous semiconductor film. The technology set forth in Patent Document 2 uses a laser crystallizing method to cause a higher level of crystallinity in the TFD semiconductor layer than the crystallinity in the TFT semiconductor layer. In the manufacturing method set forth in Patent Document 2, the crystalline semiconductor film, having optimal crystallinity as a TFT semiconductor layer, is irradiated with a laser beam to cause melting and recrystallization, to obtain a crystalline semiconductor film having greater crystallinity, as the semiconductor layer for the TFDs. Patent Document 2 discloses the average surface roughness (Ra) of the TFD semiconductor layer, which has undergone the melting and recrystallization, as being greater than the average surface roughness of the TFT semiconductor layer. The crystalline semiconductor film that is used as the TFT semiconductor layer is formed through crystallizing an amorphous semiconductor film through a method that uses a catalyst element, in the same way as in Patent Document 1, or through a method of irradiation with a laser beam.

RELATED ART DOCUMENTS

Patent Documents

Patent Document 1: Japanese Patent Application Laid-Open Publication No. H6-275808
Patent Document 2: Japanese Patent Application Laid-Open Publication No. 2009-10125

SUMMARY OF THE INVENTION

Problems to be Solved by the Invention

In the technology set forth in Patent Document 2, the crystallinity of the TFD semiconductor layer is increased in order to suppress the variability in the S/N ratio of the TFDs, but because the surface roughness of the TFT semiconductor layer is not adequately suppressed, there is a problem in that the reliability of the TFTs is low.

The present invention was created in order to solve the problems set forth above, and an object thereof is to increase the optical sensitivity of the TFDs, and to increase the reliability of the TFTs, beyond that which is conventional.

Means for Solving the Problems

A semiconductor device according to the present invention includes: a substrate; a thin film transistor having a first semiconductor layer that is supported on the substrate; a thin film diode having a second semiconductor layer that is supported on the substrate; and a metal layer that is formed between the substrate and the second semiconductor layer; wherein: the first semiconductor layer is a laterally grown crystalline semiconductor film; the second semiconductor layer is a crystalline semiconductor film that includes fine crystal grains; and the average surface roughness of the second semiconductor layer is greater than the average surface roughness of the first semiconductor layer.

A display device according to the present invention includes the aforementioned semiconductor device. For example, the display device is provided with an optical touch panel, where the thin film diode is a photodiode of the touch panel. Moreover, the thin film transistor is, for example, a pixel thin film transistor that is provided for each individual pixel of the display device.

A semiconductor device manufacturing method according to the present invention includes: a step (a) of preparing a substrate; a step (b) of forming a metal layer in an island-shapes on the substrate; a step (c) of depositing an amorphous semiconductor film over essentially the entire surface of the substrate, so as to cover the metal layer; a step (d) of obtaining a crystalline semiconductor film through crystallizing the amorphous semiconductor film through an SLS method using a laser beam of a first illumination energy density; and a step (e) of directing a laser beam of second illumination energy density onto at least a first part of the crystalline semiconductor film that is over the metal layer to selectively melt and recrystallize only the first part of the crystalline semiconductor film; wherein a thin film diode is manufactured that includes the recrystallized first portion as a semiconductor layer and a thin film transistor is manufactured that includes a second portion of the crystalline semiconductor film, different from the first portion, as a semiconductor layer.

In a specific form of embodiment, the step (e) is a step wherein essentially the entire surface of the crystalline semiconductor film is irradiated with a laser beam of a second illumination energy density, wherein the second illumination energy density is less than the first illumination energy density.

Effects of the Invention

The present invention improves the TFD optical sensitivity and an improves the TFT reliability, over that which is conventional, in a semiconductor device that is provided with TFTs and TFDs that are fabricated on the same substrate.

DETAILED DESCRIPTION OF EMBODIMENTS

The figures will be referenced below to describe a semiconductor device according to embodiments of the present invention, and a manufacturing method of the same; however, embodiments according to the present invention are not limited thereto.

Figure 1:
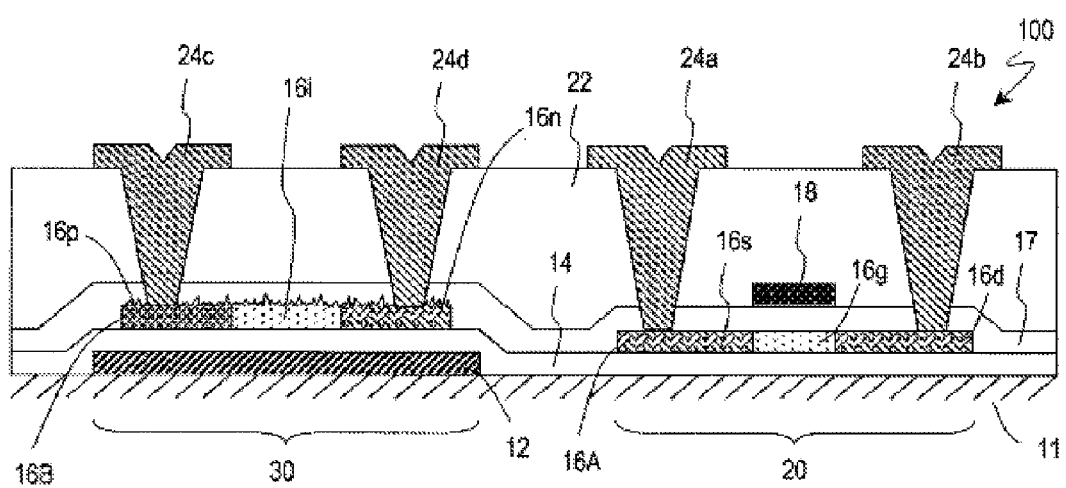
FIG. 1 is a schematic cross-sectional diagram of a semiconductor device 100 of an embodiment according to the present invention.

FIG. 1 shows a schematic cross-sectional diagram of a semiconductor device 100 according to an embodiment of the present invention.

The semiconductor device 100 is provided with a substrate 11, a thin film transistor (hereinafter termed a "TFT") 20, having a first semiconductor layer 16A that is supported on the substrate 11, a thin film diode (hereinafter termed a "TFD") 30, having a second semiconductor layer 16B that is supported on the substrate 11, and a metal layer 12 that is formed between the substrate 11 and the second semiconductor layer 16B.

The first semiconductor layer 16A of the TFT 20 has a source region 16s, a drain region 16d, and a channel region 16g that is formed between the source region 16s and the drain region 16d. The first semiconductor layer 16A is covered by a gate insulating film 17, and a gate electrode 18 is provided so as to face the channel region 16g across the gate insulating film 17. The TFT 20 is a doped gate-type TFT. An interlayer insulating film 22 that covers the gate electrode 18 is formed over essentially the entire surface of the substrate 11, and the surface thereof is planarized. A source electrode 24a contacts the source region 16s of the first semiconductor layer 16A, and a drain electrode 24b contacts the drain region 16d of the first semiconductor layer 16A, in contact holes that are formed in the interlayer insulating film 22 and the gate insulating film 17.

The second semiconductor layer 16B of the TFD 30 is formed on the metal layer 12, and is positioned within the metal layer 12 when viewed in a direction normal to the substrate 11. Consequently, light that is incident on the TFD 30 from the substrate 11 side is blocked by the metal layer 12, and does not arrive at the second semiconductor layer 16B. The second semiconductor layer 16B has a p-type region (p$^+$ region) 16p, an n-type region (n$^+$ region) 16n, and an intrinsic region (i-type region) 16i that is formed between the p-type region 16p and the n-type region 16n. The p-type region 16p and the n-type region 16n are connected to the respective electrodes 24c and 24d in contact holes that are formed in the interlayer insulating film 22 and the gate insulating film 17.

The first semiconductor layer 16A is a laterally grown crystalline semiconductor film, and the second semiconductor layer 16B is a crystalline semiconductor film that includes fine crystal grains. The first semiconductor layer 16A is a crystalline semiconductor film that is formed through a sequential lateral solidification method (hereinafter referred to as "SLS method"), and that has a high mobility. The first semiconductor layer 16A is formed with crystal grains of a length of, for example, 3 μm, depending on the distance scanned in the lateral direction by the first laser beam. The growth direction of the crystal grain is within the plane of the substrate, and is parallel to the direction of scanning of the laser beam. Setting the direction of growth of the crystal grain so as to be parallel to the direction of the TFT channel makes it possible to obtain a high mobility.

On the other hand, the second semiconductor layer 16B is a crystalline semiconductor film that has been recrystallized by the second laser beam. Preferably, a laser beam (such as a solid-state laser (SHG-YAG laser: wavelength=532 nm)) that has a wavelength that is longer than that of the first laser beam (for example, and excimer laser: wavelength=308 nm) is used as the second laser beam for recrystallization. If an excimer laser were used, there would be the danger of melting the entirety of the semiconductor film in the regions irradiated by the laser beam, regardless of whether or not there is the underlying metal layer 12. That is, if an excimer laser were used, then it may not be possible to melt selectively only the portion of the semiconductor film that is over the metal layer 12.

Here, the average surface roughness of the second semiconductor layer 16B of the TFD 30 is greater than the average surface roughness of the first semiconductor layer 16A of the TFT 20. The first semiconductor layer 16A is formed through the SLS method, and thus has a planar surface. In contrast, ridges (protruding portions) are formed in the second semiconductor layer 16B at the time of recrystallization through crystal growth in the direction that is normal to the substrate 11. The "average surface roughness" of the first semiconductor layer 16A and the second semiconductor layer 16B is defined as the arithmetic mean roughness Ra specified by, for example, JISB 0601-1994. The surface roughness can be measured using an atomic force microscope (AFM). For example, preferably, the average surface roughness of the first semiconductor layer 16A is less than 8 nm, and the average surface roughness of the second semiconductor layer 16B is greater than or equal to 8 nm.

The first semiconductor layer 16A for the TFT 20 is formed of a laterally grown crystalline semiconductor film, and thus has a greater mobility than in the TFTs set forth in Patent Document 2 above. Moreover, the surface of the first semiconductor layer 16A is planar, and so the reliability (and, in particular, the gate withstand voltage) is high. On the other hand, the second semiconductor layer 16B for the TFD 30 is formed of a polycrystalline semiconductor film in which the crystallinity is relatively low, and thus the optical sensitivity is high. Furthermore, because the surface of the second semiconductor layer 16B is relatively rough, the reflection of the incident light on the second semiconductor layer 16B is suppressed, resulting in an increase in the light current. That is, the sensitivity to ambient light of the TFD 30, or in other words, the S/N ratio relative to light (the current value ratio for light/dark) is higher than that of the TFD set forth in Patent Document 2, above.

A method for manufacturing the semiconductor device 100 will be described next in reference to FIG. 2(a) through (d). While an example that uses silicon as the semiconductor will be described below, there is no limitation thereto, and germanium, or a silicon-germanium mixture, may be used instead.

Figure 2:
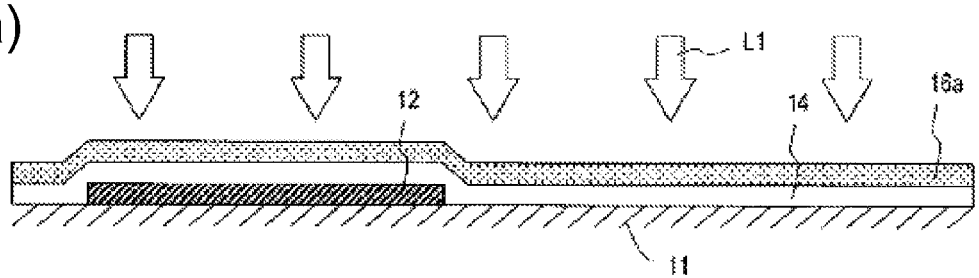
FIGS. 2(a) through (d) are schematic cross-sectional diagrams for describing a method for manufacturing the semiconductor device 100.
Figure 2:
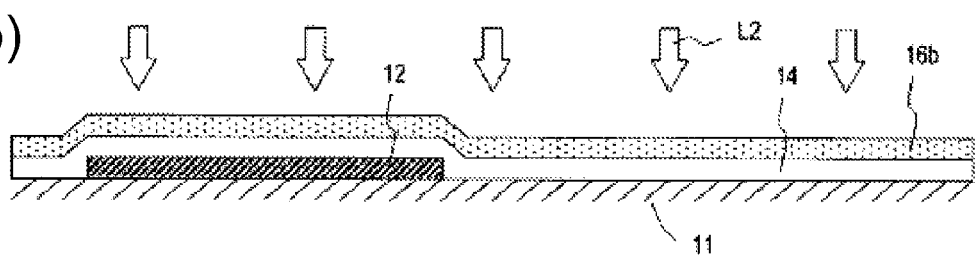
Figure 2:
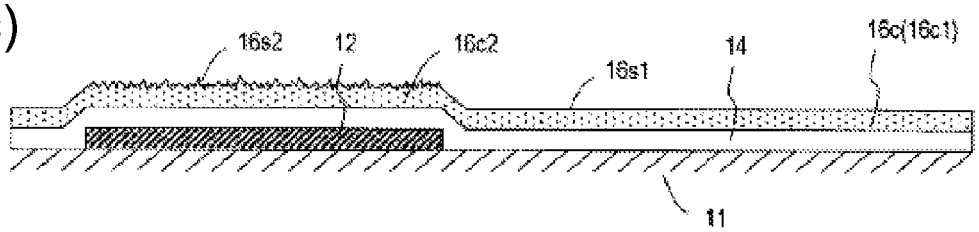
Figure 2:
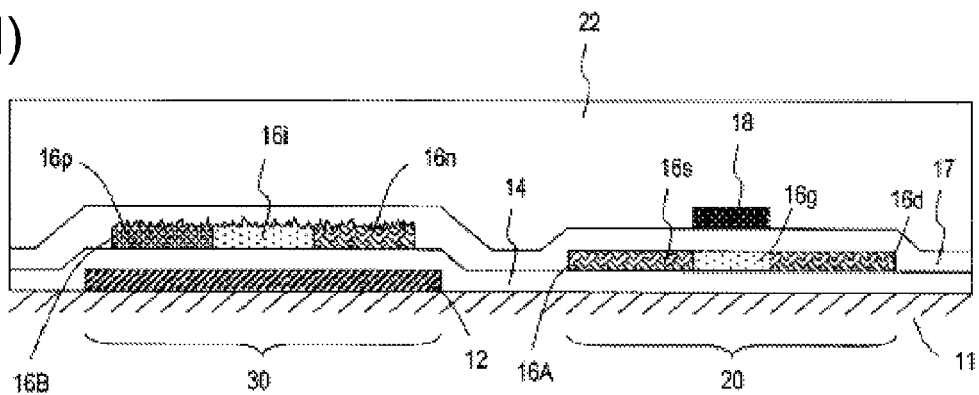

First, as illustrated in FIG. 2(a), a metal layer 12 is formed on a substrate 11. A film of a thickness of no less than 50 nm and no more than 300 nm, for example, of a high-melting-point metal (for example, tantalum (Ta), tungsten (W), or molybdenum (Mo)) is deposited on a transparent insulating substrate (for example, a glass substrate) 11, and the metal layer 12 can be formed through patterning the resulting film through a photolithographic process.

Thereafter, a base film 14 that covers the metal layer 12 is deposited over essentially the entire surface of the substrate 11. The base film 14 is a silicon oxide film, a silicon nitride film, or a silicon oxynitride film, that is formed using, for example, a plasma CVD method.

Following this, an amorphous silicon film 16a is formed on essentially the entire surface of the substrate 11 using a known method, such as the plasma CVD method or a sputtering method. The thickness of the amorphous silicon film 16a is, for example, between 20 and 150 nm, and, preferably, between 30 and 80 nm.

Thereafter, the amorphous silicon film 16a is crystallized through the SLS method using a laser beam L1 having a first illumination energy density. The wavelength of the laser beam L1 is, for example, 308 nm, and the first illumination energy density is in a range of, for example, no less than 600 mJ/cm$^2$ and no more than 1500 mJ/cm$^2$. A crystalline silicon film 16b, in which the crystal is grown in the lateral direction, is obtained through this step.

Following this, as illustrated in FIG. 2(b), the laterally grown crystalline silicon film 16b is irradiated with a laser beam L2 of a second illumination energy density to selectively melt and recrystallize only those portions of the laterally grown crystalline silicon film 16b that are positioned over the metal layer 12. At this time, the wavelength of the laser beam L2 is, for example, 532 nm, and the second illumination energy density is in the range of, for example, no less than 250 mJ/cm$^2$ and no more than 450 mJ/cm$^2$, which is less than the first illumination energy density. The energy density of the laser beam L2 that is emitted at this time is adjusted so as to selectively melt only those portions of the laterally grown crystalline silicon layer 16b that are positioned over the metal layer 12. The portion of the laterally grown crystalline silicon film 16b that is positioned over the metal layer 12 not only absorbs a portion of the laser beam L2 that is incident from above in the figure, but also absorbs a portion of the laser beam that passes through the laterally grown crystalline silicon layer 16b and is reflected by the metal layer 12. In contrast, those parts of the laterally grown crystalline silicon film 16b where the metal layer 12 is not formed on the substrate 11 absorb only a portion of the laser beam L2 that, in the figure, is incident from above. Consequently, the portion that is positioned over the metal layer 12 of the laterally grown crystalline silicon film 16b absorbs more energy than the portion of the laterally grown crystalline silicon film 16b where the metal layer 12 is not formed on the substrate 11, making it possible to melt selectively only those portions of the laterally grown crystalline silicon film 16b that are positioned over the metal layer 12.

While an example is shown here in which the laser beam L2 of the second illumination energy density illuminates essentially the entire surface of the laterally grown crystalline silicon film 16b, the laser beam L2 may be caused to illuminate only those portions of the laterally grown crystalline silicon film 16b that are positioned over the metal layer 12. However, as illustrated, illuminating essentially the entire surface of the laterally grown crystalline silicon film 16b with the laser beam L2 of the second illumination energy density provides the benefit of being able to simplify the scanning of the laser beam.

As described above, the melting and recrystallization of the portion of the laterally grown crystalline silicon film 16b that is positioned over the metal layer 12 forms a polycrystalline silicon film 16c2, which has an average crystal grain of, for example, no less than about 10 nm and no more than about 1000 nm, on the metal layer 12, as shown in the crystalline silicon layer 16c illustrated in FIG. 2(c). The average surface roughness of this surface 16s2 is in a range of no less than 8 nm and no more than 50 nm. On the other hand, the laterally grown crystalline silicon film 16c1 on the substrate 11 where the metal layer 12 is not formed remains with the average surface roughness of the surface 16s1 of less than 8 nm, with the crystal state having not undergone a change through the second laser illumination.

Thereafter, as illustrated in FIG. 2(d), the unneeded regions of the crystalline silicon layer 16c are removed in order to perform interelement isolation, after which island-shaped first semiconductor layers 16A that will later serve as the active regions (the source regions 16s, drain regions 16d, and channel regions 16g) of the TFT 20, and the island-shaped second semiconductor layers 16B, which will later serve as the active regions (the p-type regions 16p, the n-type regions 16n, and the intrinsic regions 16i) of the TFD 30, are formed. Following this, the gate insulating film 17, which covers the first semiconductor layer 16A and the second semiconductor layer 16B, is formed. The gate insulating film 17 is, for example, formed of a silicon oxide film with a thickness of between 20 and 150 nm. Following this, a gate electrode 18 is formed on the gate insulating film 17 over the first semiconductor layer 16A. The gate electrode 18 may be fabricated through depositing, for example, a film of a high-melting-point metal such as W, Ta, Ti, or Mo, onto the gate insulating film 17 through a sputtering method, a CVD method, or the like, and then patterning. The thickness of the gate electrode 18 is, for example, between 300 and 600 nm.

Thereafter, ion implantation of an n-type impurity (such as phosphorus) and a p-type impurity (such as boron) is performed using a well-known method to form the source region 16s, the drain region 16d, and the channel region 16g of the TFT 20, and the p-type region 16p, the n-type region 16n, and the intrinsic region 16i of the TFD 30. Following this, an interlayer insulating film 22 is formed using, for example, a photosensitive resin. The thickness of the interlayer insulating film 22 is between 0.5 μm and 4 μm.

Thereafter, contact holes are formed in the interlayer insulating film 22 and the gate insulating film 17 to obtain the semiconductor device 100, as illustrated in FIG. 1, through forming electrodes 24a and 24b using, for example, the aforementioned high-melting-point metal.

Figure 3:
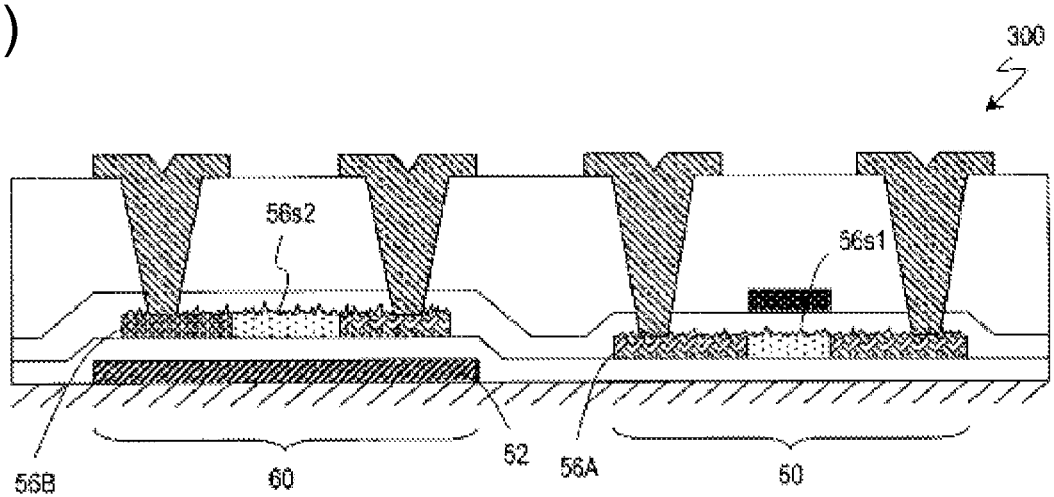
FIGS. 3(a) and (b) are schematic cross-sectional diagrams of semiconductor devices 300 and 400 of respective comparative examples.
Figure 3:
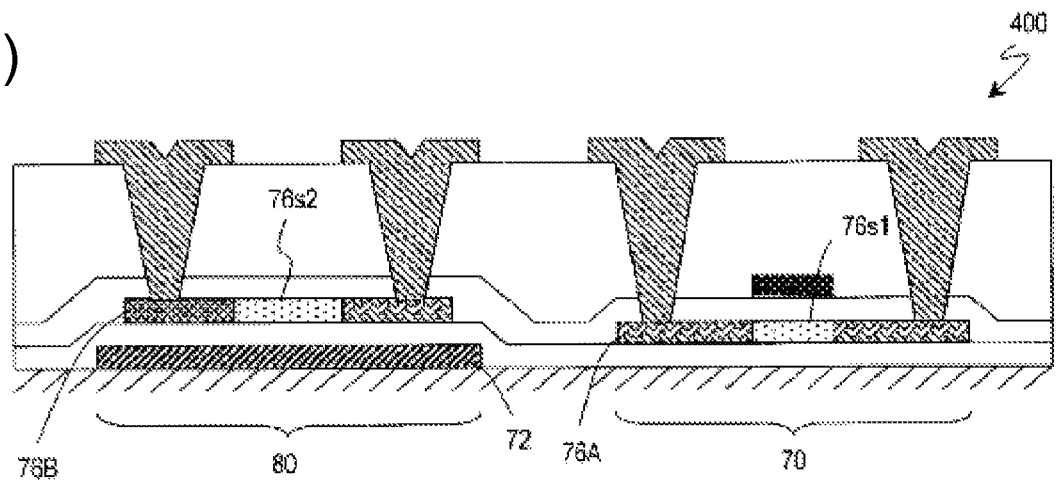

FIGS. 3 (a) and (b) are schematic cross-sectional diagrams of semiconductor devices 300 and 400 of comparative examples.

The semiconductor device 300 of the comparative example illustrated in FIG. 3(a) has a TFT 50 and a TFD 60. Both the first semiconductor layer 56A of the TFT 50 and the second semiconductor layer 56B of the TFD 60 are crystalline silicon films wherein an amorphous silicon film has been melted and crystallized using the ELA method. The surfaces 56s1 and 56s2 thereof both have ridges that are formed at the time of crystallization. The average surface roughness is in the range of no less than 8 nm to no more than 50 nm. Even though the optical sensitivity of the TFD 60 is high because the second semiconductor layer 56B of the TFD 60 has a rough surface, there is a problem in that the reliability (and in particular, the gate withstand voltage) is low because the first semiconductor layer 56A of the TFT 50 has a rough surface. Moreover, there is a problem in that the mobility is low because the crystallinity of the first semiconductor layer 56A is not high (that is, because it is formed from relatively small crystal grains, and has a high number of crystal grain boundaries in the channel region).

The semiconductor device 400 of the comparative example illustrated in FIG. 3(b) has a TFT 70 and a TFD 80. Both the first semiconductor layer 76A of the TFT 70 and the second semiconductor layer 76B of the TFD 80 are laterally grown crystalline silicon films wherein an amorphous silicon film has been crystallized through the SLS method. The surfaces 76s1 and 76s2 thereof both have high planarities, and the average surface roughness is in the range of no less than 3 nm to no more than 6 nm. The reliability (and especially the gate withstand voltage) is high because the first semiconductor layer 76A of the TFT 70 has a planar surface. Additionally, the mobility is also high because the first semiconductor layer 76A is a laterally grown crystalline silicon film. However, the second semiconductor layer 76B of the TFD 80 is formed from a crystalline silicon film having high crystallinity, and has a planar surface, and thus there is a problem in that the TFD 80 has low optical sensitivity.

As described above, in the semiconductor device 100 of the present embodiment, the first semiconductor layer 16A of the TFT 20 is formed of a laterally grown crystalline semiconductor film, so the mobility in the TFT 20 is high, and the surface of the first semiconductor layer 16A is planar, so the reliability of the TFT 20 is high as well. The second semiconductor layer 16B of the TFD 30 is formed of a polycrystalline semiconductor film having a relatively low crystallinity, and the surface of the second semiconductor layer 16B is relatively rough. Thus, the optical sensitivity of the TFD 30 to ambient light is high.

Figure 4:
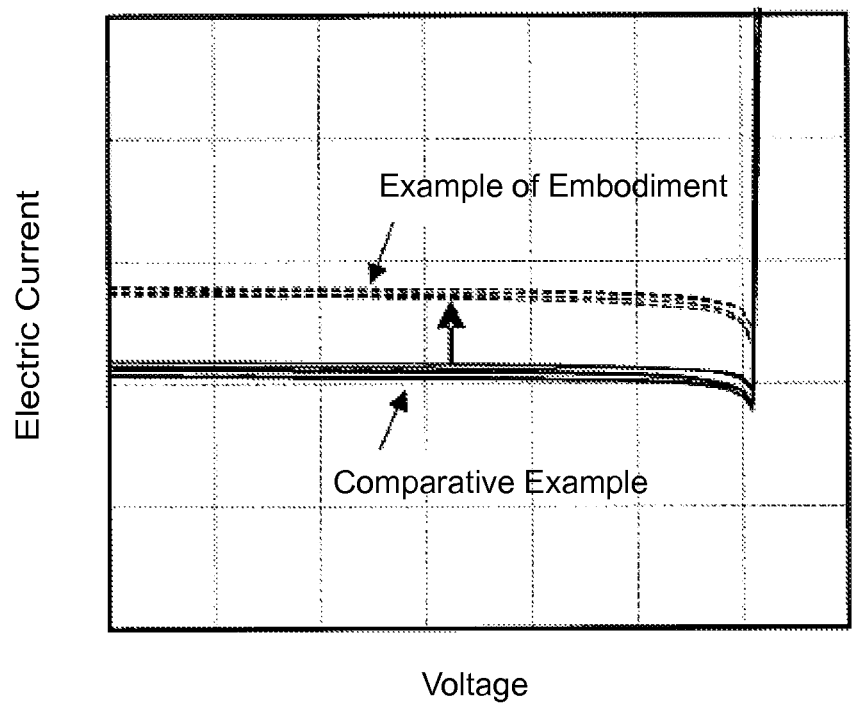
FIG. 4 is a graph illustrating the photovoltaic current characteristics of a TFD provided in a semiconductor device in an embodiment according to the present invention, and of a TFD provided in a semiconductor device of a comparative example.

FIG. 4 shows a graph of the photovoltaic current characteristics of the TFD 30, which is provided in the semiconductor device 100 of the present embodiment, and the TFD 80, which is provided in the semiconductor device 400 of the comparative example.

As apparent from the graph of the photovoltaic current characteristics in FIG. 4, the TFD 30 has a larger photovoltaic current and a higher optical sensitivity than the TFD 80, which has the laterally grown crystalline silicon film 76B that has a planar surface, as the result of the second semiconductor layer 16B being formed of the polycrystalline silicon film having the rough surface.

Figure 5:
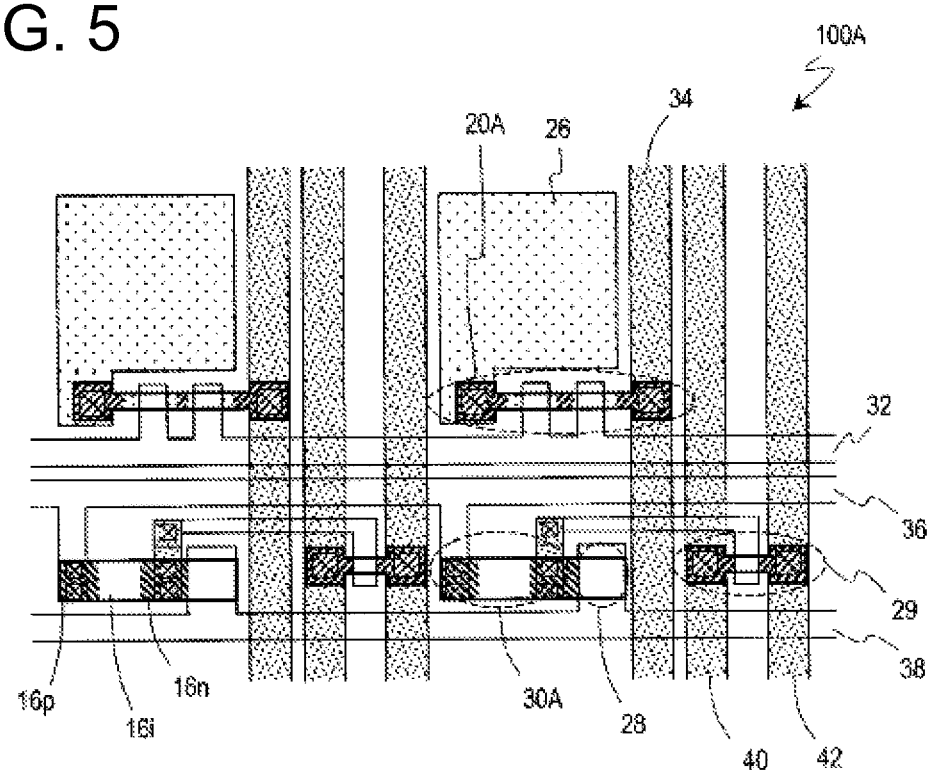
FIG. 5 is a schematic plan view of a TFT substrate for a liquid crystal display device with a touch panel according to an embodiment set forth in the present invention.
Figure 6:
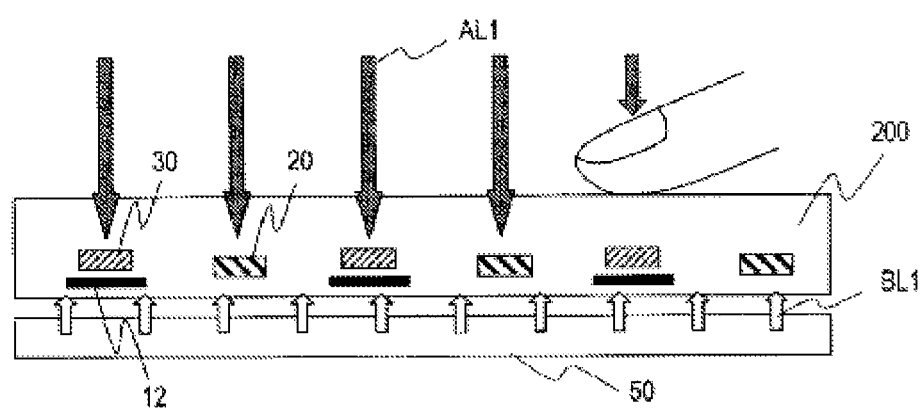
FIG. 6 is a schematic cross-sectional diagram for describing a state of use of a liquid crystal display device with a touch panel according to an embodiment of the present invention.

A liquid crystal display device with an optical touch panel according to an embodiment of the present invention will be described next with reference to FIG. 5 and FIG. 6. FIG. 5 is a schematic plan view diagram of a TFT substrate 100A of a liquid crystal display device with a touch panel according to an embodiment of the present invention, and FIG. 6 is a schematic cross-sectional diagram for describing a state of use of the liquid crystal display device with the touch panel according to an embodiment of the present invention.

The TFT substrate 100A illustrated in FIG. 5 is an example of a semiconductor device of the embodiment of the present invention, and has a TFT 20A with a structure that is similar to that of the TFT 20 illustrated in FIG. 1, and a TFD 30A with a structure that is similar to the TFD 30 illustrated in FIG. 1. Note that the aspect that the TFT 20A has a double-gate structure is different from that of the TFT 20 illustrated in FIG. 1.

The TFT substrate 100A is provided with a plurality of display portions (pixels), each having a pixel electrode 26 and a pixel switching TFT 20A, with an optical sensor portion disposed adjacent to each display portion, including an optical sensor photodiode 30A, a signal storing capacitor 28, and an optical sensor follower TFT 29. Here, a case is shown wherein a single optical sensor portion is provided for each pixel. A TFT 20A source region is connected to a pixel source bus line 34, and a drain region is connected to the pixel electrode 26. The TFT 20A is turned ON/OFF through signals from a pixel gate bus line 32. As a result, a voltage is applied to a liquid crystal layer through the pixel electrode 26 and the opposing electrode that is formed on a front substrate that is disposed to face the TFT substrate 100A, to perform a display through varying the orientation states of the liquid crystal layer.

On the other hand, the optical sensor photodiode 30A has a structure similar to that of the TFD 30 described above, and are provided with a p-type region 16p, an n-type region 16n, and an intrinsic region 16i that is positioned between these regions. The signal storing capacitor 28 forms, for example, a capacitance by the gate insulating film, with the gate electrode layer and the Si layer as electrodes. The p-type region 16p in the optical sensor photodiode 30A is connected to an optical sensor RST signal line 36, the n-type region 16n is connected to an electrode (for example, the Si layer) at the bottom of the signal storing capacitor 28, connecting to an optical sensor RWS signal line 38 through the capacitor 28. Moreover, the n-type region 16n is connected to the gate electrode layer in the optical sensor follower TFT 29. The source and the drain regions of the optical sensor follower TFT 29 are connected, respectively, to an optical sensor VDD signal line 40 and an optical sensor COL signal line 42.

In this way, the optical sensor photodiode 30A, the signal storing capacitor 28, and the optical sensor follower TFT 29 constitute an optical sensor driving circuit. The operation at the time of optical sensing through this driving circuit will be described below.

(1) First, an RWS signal is written to the signal storing capacitor 28 through the RWS signal line 38. Doing so produces an electric field that is positive on the n-type region 16n side in the optical sensor photodiodes 30A, in a reverse-biased state relative to the optical sensor photodiodes 30A. (2) At the optical sensor photodiodes 30A on the substrate surface that are placed at regions illuminated with light, photo leakage current is produced, removing the charge to the RST signal line 36 side. (3) As a result, the electropotential on the n-type region 16n side will fall, and the gate voltage that is applied to the optical sensor follower TFT 29 will change depending on this change in electropotential. (4) A VDD signal from the VDD signal line 40 is applied to the source side of the optical sensor follower TFT 29. When the gate voltage is changed, as described above, the value of the electric current that flows to the COL signal line 42 that is connected to the drain side will change, thus making it possible to read this electric signal from the COL signal line 42. (5) The RST signal from the COL signal line 42 is written to the optical sensor photodiode 30A, to reset the electropotential of the signal storing capacitor 28. The operations in (1) through (5), above, are repeated by way of scanning, thus making optical sensing possible.

A state of use of the liquid crystal display device with the touch panel will be described with reference to FIG. 6.

A liquid crystal display device is provided with a liquid crystal module 200 and a backlight 50 that is disposed on the back side of the liquid crystal module 200. Although not shown here, the liquid crystal module 200 is structured from a back substrate having transparency, a front substrate that is disposed so as to face the back substrate, and a liquid crystal layer that is provided between these substrates. The liquid crystal module 200 has a plurality of display portions (primary color pixels), where each display portion has a pixel electrode (not shown) and a pixel switching thin film transistor 20 that is connected to the pixel electrode. Moreover, an optical sensor portion that includes a TFD 30 is disposed adjacent to each display portion. Although not illustrated, a color filter is disposed on the viewer side of each display portion, but no color filter is disposed on the viewer side of the optical sensors. The metal layer 12 is disposed between the TFDs 30 and the backlight 50, so that light BL1 from the backlight 50 is blocked by the metal layer 12 so as not to be incident on the TFDs 30 and that only the ambient light AL1 is incident on the TFDs 30. This ambient light AL1 is incident on the TFDs 30, and is sensed thereby, to produce an optical sensing-type touch panel.

INDUSTRIAL APPLICABILITY

The present invention can be applied to semiconductor devices that are provided with TFTs and TFDs, and can be applied to electronic equipment in a wide variety of fields that is equipped with such semiconductor devices. The present invention is well-suited for use in, particularly, active-matrix liquid crystal display devices, organic EL display devices, image sensors, optical sensors, and the like, and in electronic equipment incorporating the same. The application of the present invention to display devices with optical sensor functions that use TFDs and to electronic equipment provided with the same is particularly useful. Additionally, it may also be applied to image sensors that use TFDs, and to image sensors equipped with driving circuits that use TFTs.

DESCRIPTION OF REFERENCE CHARACTERS

11 substrate (transparent substrate)
12 metal layer
14 base film
16A first semiconductor layer
16B second semiconductor layer
16*a* amorphous semiconductor layer (amorphous silicon layer)
16*b* laterally grown crystalline silicon film
16*c* crystalline silicon film
16*c*1 laterally grown crystalline silicon film
16*c*2 polycrystalline silicon film
16*s* source region
16*d* drain region
16*g* channel region
16*p* p-type region
16*n* n-type region
16*i* intrinsic region (i-type region)
17 gate insulating layer
18 gate electrode
20 thin film transistor (TFT)
22 interlayer insulating film
24*a*, 24*b*, 24*c*, 24*d* electrodes
30 thin film diode (TFD)
100 semiconductor device
100A TFT substrate
200 liquid crystal module

The invention claimed is:

1. A method for manufacturing a semiconductor device, comprising:
a step (a) of preparing a substrate;
a step (b) of fabricating an island-shaped metal layer on the substrate;
a step (c) of depositing an amorphous semiconductor film over essentially an entire surface of the substrate, so as to cover the metal layer;
a step (d) of obtaining a crystalline semiconductor film through crystallizing the amorphous semiconductor film through an SLS method using a laser beam of a first illumination energy density;
a step (e) of directing a laser beam of second illumination energy density onto at least a first part of the crystalline semiconductor film that is over the metal layer to selectively melt and recrystallize only the first part of the crystalline semiconductor film; and
producing a thin film diode that includes, as a semiconductor layer, the first part that has undergone recrystallization, and a thin film transistor that includes, as a semiconductor layer, a second part of the crystalline semiconductor film that is different from the first part.

2. The manufacturing method for a semiconductor device as set forth in claim 1, wherein the step (e) includes directing the laser beam of the second illumination energy density onto essentially an entire surface of the crystalline semiconductor film, the second illumination energy density being less than the first illumination energy density.

* * * * *